(12) United States Patent  (10) Patent No.: US 9,000,851 B1
Oran et al.  (45) Date of Patent: Apr. 7, 2015

(54) CAVITY RESONATORS INTEGRATED ON MMIC AND OSCILLATORS INCORPORATING THE SAME

(75) Inventors: Ekrem Oran, Nashua, NH (US); Ahmed Ibrahim, North Chelmsford, MA (US); Michael Koechlin, Chelmsford, MA (US)

(73) Assignee: Hittite Microwave Corporation, Chelmsford, MA (US)

( * ) Notice: Subject to any disclaimer, the term of this patent is extended or adjusted under 35 U.S.C. 154(b) by 8 days.

(21) Appl. No.: 13/548,394

(22) Filed: Jul. 13, 2012

Related U.S. Application Data (60) Provisional application No. 61/572,320, filed on Jul. 14, 2011.

(51) Int. Cl.
  *H03B 5/18* (2006.01)
  *H01P 7/06* (2006.01)
  *H03F 1/12* (2006.01)

(52) U.S. Cl.
  CPC ........................................ *H03F 1/12* (2013.01)

(58) Field of Classification Search
  USPC ................ 331/96, 97, 107 DP, 154; 333/219, 333/219.1, 227, 230, 231, 235
  See application file for complete search history.

(56) References Cited

U.S. PATENT DOCUMENTS

| | | | |
|---|---|---|---|
| 2,487,619 A * | 11/1949 | Usselman | 333/233 |
| 4,937,533 A * | 6/1990 | Livingston | 333/126 |
| 5,821,836 A | 10/1998 | Katehi et al. | |
| 5,917,388 A * | 6/1999 | Tronche et al. | 333/246 |
| 5,949,309 A * | 9/1999 | Correa | 333/202 |
| 5,982,250 A * | 11/1999 | Hung et al. | 333/26 |
| 6,160,463 A * | 12/2000 | Arakawa et al. | 333/202 |
| 6,362,706 B1 | 3/2002 | Song et al. | |
| 6,411,182 B1 | 6/2002 | Song et al. | |
| 6,535,086 B1 * | 3/2003 | Liang et al. | 333/219.1 |
| 6,771,147 B2 * | 8/2004 | Mongia | 333/204 |
| 6,801,107 B2 * | 10/2004 | Chen et al. | 333/234 |
| 6,924,718 B2 * | 8/2005 | Snyder | 333/202 |
| 7,187,256 B2 * | 3/2007 | Oran | 333/247 |
| 7,196,598 B2 * | 3/2007 | Maruhashi et al. | 333/212 |
| 7,570,137 B2 | 8/2009 | Kintis et al. | |
| 7,940,148 B2 * | 5/2011 | Knecht et al. | 333/219 |

\* cited by examiner

*Primary Examiner* — Levi Gannon
(74) *Attorney, Agent, or Firm* — Knobbe, Martens, Olson & Bear LLP (57) ABSTRACT

A cavity resonator integrated on a monolithic microwave integrated circuit (MMIC) is provided. The cavity resonator includes a cavity defined by an upper metal surface and a lower metal surface embedded in a low conductivity semiconductor, and a plurality of discrete metal connections coupled between the upper and lower metal surfaces, and at least one port for coupling to the cavity electromagnetically.

20 Claims, 10 Drawing Sheets

CAVITY RESONATORS INTEGRATED ON MMIC AND OSCILLATORS INCORPORATING THE SAME

RELATED APPLICATIONS

This application hereby claims the benefit of and priority to U.S. Provisional Application Ser. No. 61/572,320, filed on Jul. 14, 2011, under 35 U.S.C. §§119, 120, 363, 365, and 37 C.F.R. §1.55 and §1.78, which application is incorporated herein by reference.

FIELD OF THE INVENTION

The subject invention relates to cavity resonators, and oscillators that use such a cavity resonator.

BACKGROUND OF THE INVENTION

Prior art high frequency cavity resonators have been manufactured inside semiconductor materials by micromachining a cavity and then plating the bottom and sidewalls. The cavity is then either left void or filled with dielectric and sometimes with ferroelectric materials before it is covered with a top metal or sandwiched with a second semiconductor plate. To electromagnetically couple to the cavity, combinations of microstrip and slots may be used. Examples of high frequency cavity resonators are disclosed in U.S. Pat. Nos. 5,821,836, 6,362,706, 6,411,182 and 7,570,137, which are herein incorporated by reference.

The use of high conductivity metals everywhere around the cavity may provide a very high Q (quality) factor. However, the cost associated with micromachining to create such high frequency cavity resonators can make this technique undesirable.

One application for a high frequency cavity resonator is an oscillator. Oscillators may use a resonator with two coupled ports for cascaded loop networks.

BRIEF SUMMARY OF THE INVENTION

In embodiments of the invention, a standard MMIC semiconductor substrate is used to fabricate resonant cavities preferably without the use of micromachining or non-standard MMIC production techniques. This may provide a significant cost advantage compared with prior resonant cavities created through micromachining and non-standard MMIC production techniques. In other embodiments, the resonant cavity may be integrated on MMIC with an oscillator.

The subject invention result from the realization that rather than using metals everywhere around the cavity of a cavity resonator, the use of discrete metal connections between the top and bottom metal plates embedded in MMIC reduces the quality factor only an insignificant amount yet provides a cavity resonator that is easier and less expensive to manufacture than prior devices.

In one embodiment, the subject invention features a cavity resonator integrated on a monolithic microwave integrated circuit (MMIC). The cavity resonator includes: a cavity defined by an upper metal surface and a lower metal surface embedded in a low conductivity semiconductor, and a plurality of discrete metal connections coupled between the upper and lower metal surfaces; and at least one port for coupling to the cavity electromagnetically.

In a preferred embodiment, the plurality of metal connections may couple the upper and lower metal surfaces on at least three sides of the cavity. The cavity may be an N-sided polygon. The cavity may be circular. Each metal connection may include a metal post. Each metal post may include a backside via. Each backside via may be approximately 100 um thick. The metal connections may be external to the MMIC and are selected from the group of conductive paste, wire bonds, ribbon bonds, and external packaging. The upper and lower surfaces each may include a metal surface. The cavity resonator may further include a ferroelectric material disposed above or below the cavity resonator for tuning a frequency of the cavity. The cavity may be disposed on a semiconductor substrate having metallization layers and the metal posts connect the metallization layers. The one or more ports may be on a side of the cavity. The one or more ports may be on a surface of the cavity. The cavity resonator may include at least two ports which are coupled together to increase the current from the cavity resonator. The at least one port may include a plurality of ports that are coupled together to increase the output current. The low conductivity semiconductor may be selected from the group consisting of gallium arsenide and silicon In another embodiment, the subject invention features an oscillator integrated on a monolithic microwave integrated circuit (MMIC). The oscillator includes: a cavity resonator, including a cavity defined by an upper metal surface and a lower metal surface embedded in a low conductivity semiconductor, and a plurality of discrete metal connections coupled between the upper and lower metal surfaces on at least three sides of the cavity; a first pair of ports for coupling to the cavity electromagnetically; and a first amplifier coupled between the first pair of ports of the cavity resonator in a first feedback loop.

In a preferred embodiment, the plurality of metal connections may couple the upper and lower metal surfaces on at least three sides of the cavity. The cavity may be an N-sided polygon. The cavity may be circular. The oscillator may further include a first phase shifter coupled in the first feedback loop for tuning a frequency of the oscillator. The oscillator may further include one or more additional amplifiers coupled in the first feedback loop.

The oscillator may further include a second amplifier coupled between a second pair of ports of the cavity resonator in a second feedback loop. The oscillator may further include a second phase shifter coupled in the second feedback loop for tuning the frequency of the oscillator.

The subject invention, however, in other embodiments, need not achieve all these objectives and should not be limited to structures or methods capable of achieving these objectives.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, any claims hereof are not to be read restrictively unless there is clear and convincing evidence manifesting a certain exclusion, restriction, or disclaimer.

As described above, prior art high frequency cavity resonators have been manufactured inside semiconductor materials by micromachining a cavity and then plating the bottom and sidewalls. The cavity is then either left void or filled with dielectric and sometimes with ferroelectric materials before it is covered with a top metal or sandwiched with a second semiconductor plate. One example of a high frequency cavity resonator having a plated bottom and sidewalls is disclosed in U.S. Pat. No. 5,821,836. Also noted above, however, the costs associated with micromachining these high frequency cavity resonators may make manufacturing them undesirable.

Figure 1:
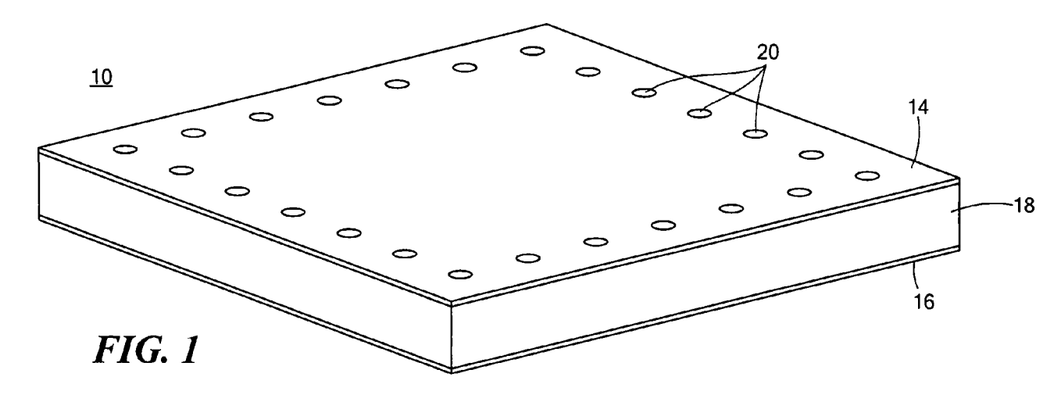
FIG. 1 is an isometric schematic diagram of a cavity resonator in accordance with an embodiment of the invention.
Figure 2:
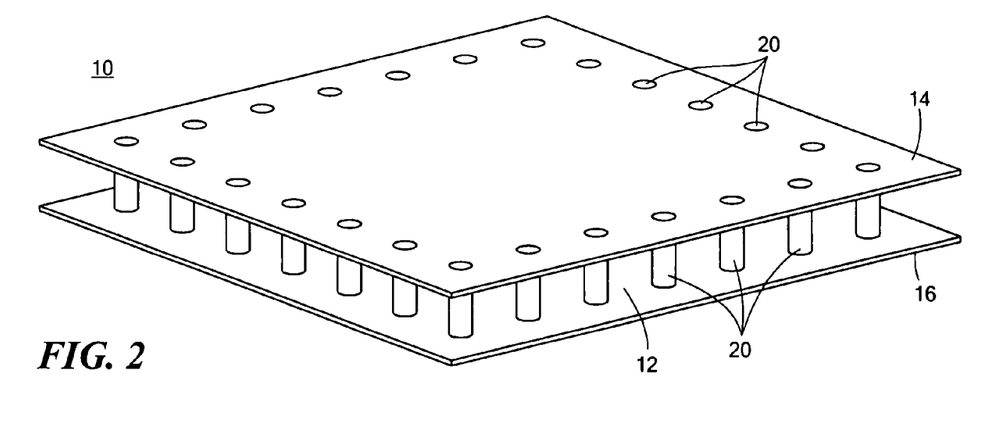
FIG. 2 is an isometric schematic diagram of the cavity resonator of FIG. 1 with portions of semiconductor removed for clarification.
Figure 3:
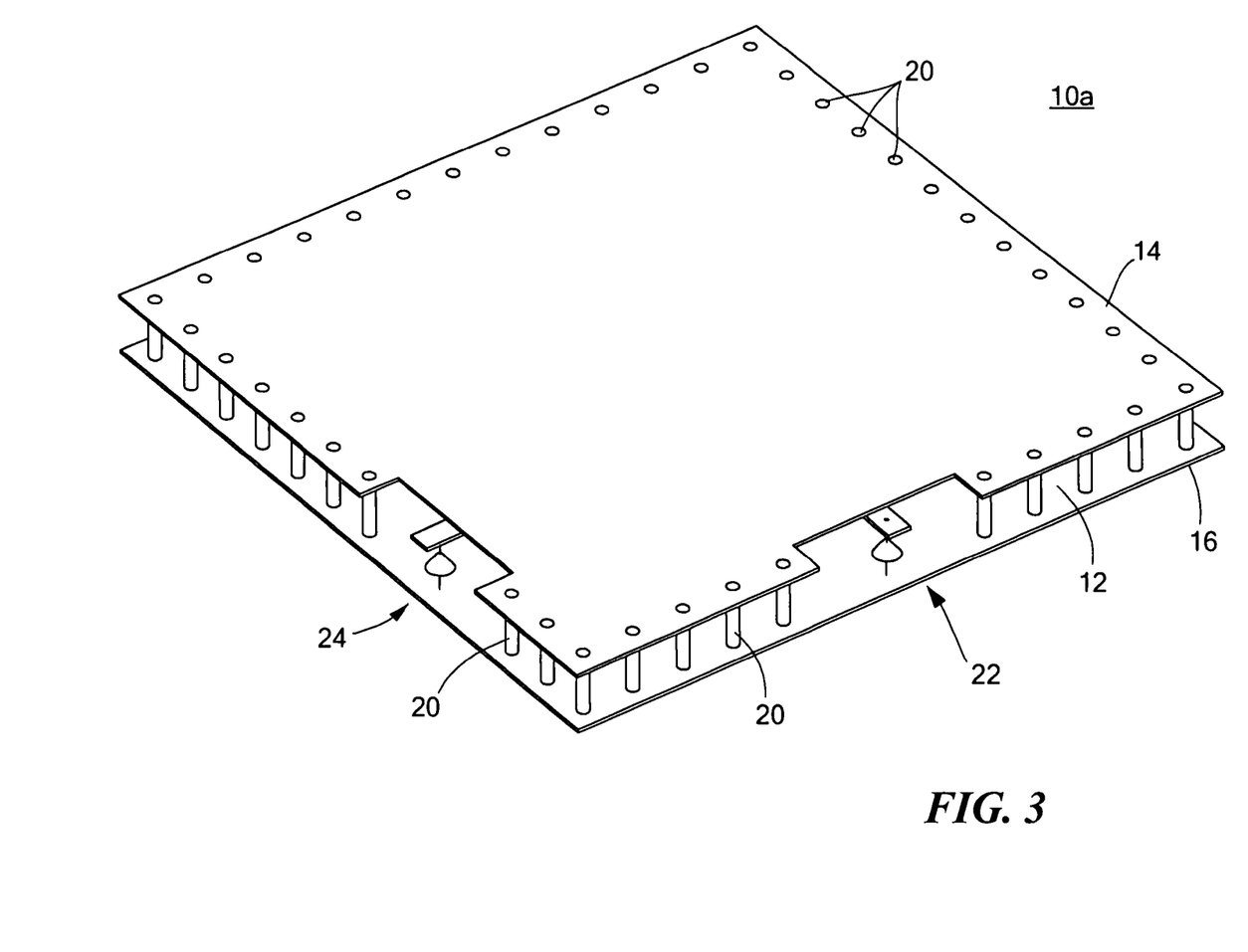
FIG. 3 is an isometric schematic diagram of a cavity resonator with vias and two ports with portions of semiconductor removed for clarification.

There is shown in FIGS. 1-3 a cavity resonator 10 integrated on a monolithic microwave integrated circuit (MMIC) in accordance with an embodiment of the subject invention. Cavity resonator 10 includes a cavity 12 defined by an upper metal surface 14 and a lower metal surface 16 embedded in a low conductivity semiconductor 18, and a plurality of discrete metal connections 20 coupled between the upper and lower surfaces. The plurality of metal connections 20 may couple the upper and lower surfaces on at least three sides of the cavity. In the embodiments of FIGS. 1-3, the discrete metal connections 20 are shown as discrete metal posts, specifically backside vias, although this is not a limitation of the invention. These vias 20 connect the top metal 14 in the upper surface to the bottom metal 16 in the bottom surface of the cavity.

In FIG. 3, Cavity resonator 10a includes ports 22 and 24 each shown with symbol denoting a port, which are placed at two different locations, specifically each on a side of the cavity 12. To physically couple in and out of the cavity, electrical ports 22 and 24 are each inserted where there used to be a via 20. To obtain more signal strength from each port, two more vias adjacent to the original via have also been removed.

When the cavity resonance frequency needs to be tuned and minimal loss in Q is required, the use of a ferroelectric material underneath the top metal surface 14 or above the bottom metal surface 16 can be used to tune the cavity resonator 12.

Figure 4:
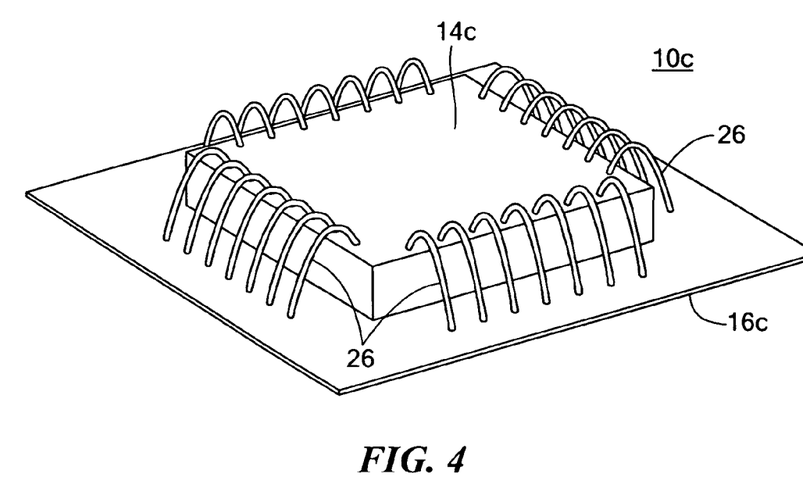
FIG. 4 is an isometric schematic diagram of a cavity resonator with external metal.

Rather than using a metal posts 20 or vias, cavity resonator 10c uses discrete external bond wires 26, FIG. 4, to define the sides of the cavity. Other forms of discrete metallic connections such as conductive paste, wire bonds, ribbon bonds, and external packaging may also be to form the sidewalls of the cavity. The metallic connections may be assembled post MMIC production in the final assembly of the cavity.

Figure 5:
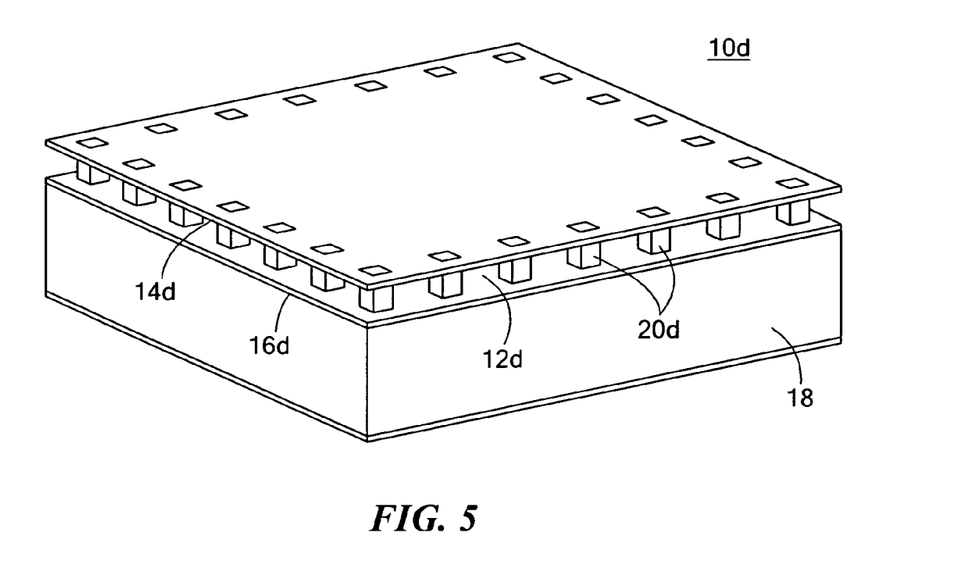
FIG. 5 is an isometric schematic diagram of a multilayer cavity resonator for red above semiconductor layer.

Some MMIC processes incorporate a relatively thick metallization and dielectric layer combination built on top of the semiconductor. In such cases the cavity resonator 10d, FIG. 5, may be built solely above semiconductor 18d with the use of metal posts 20d connecting metallization levels 14d and 16d to define cavity 12d. The use of continuous side walls is also possible. This type of construction is particularly well suited for frequencies that are even higher than 40 GHz.

Figure 6A:
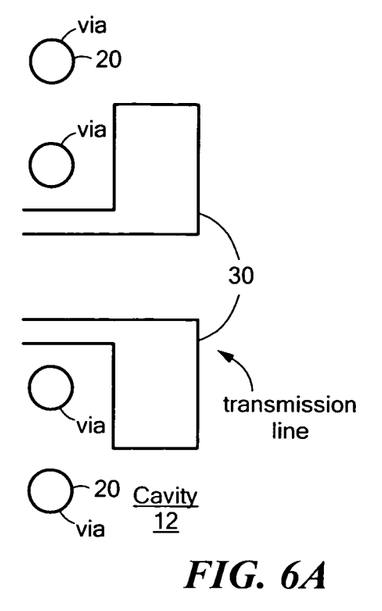
FIGS. 6A-D are schematic diagrams of exemplary structures for coupling to the cavity resonator of FIG. 1.
Figure 6B:
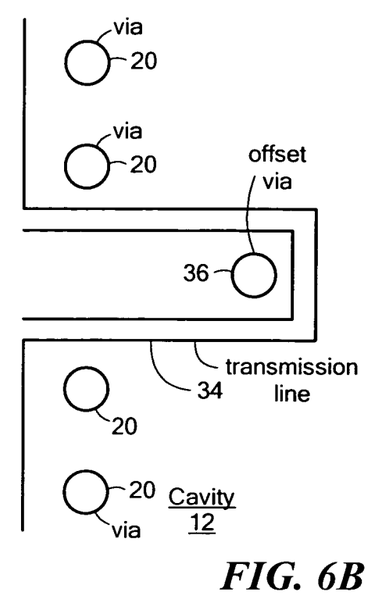
Figure 6C:
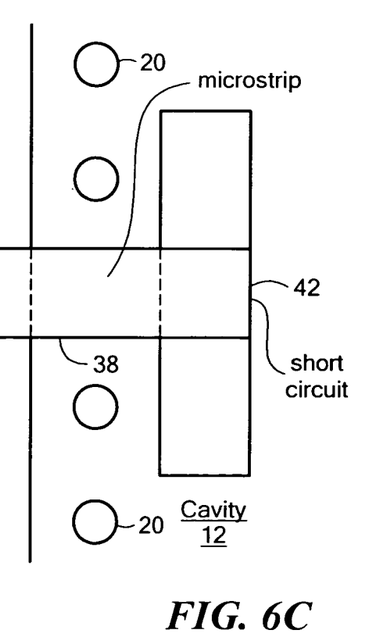
Figure 6D:
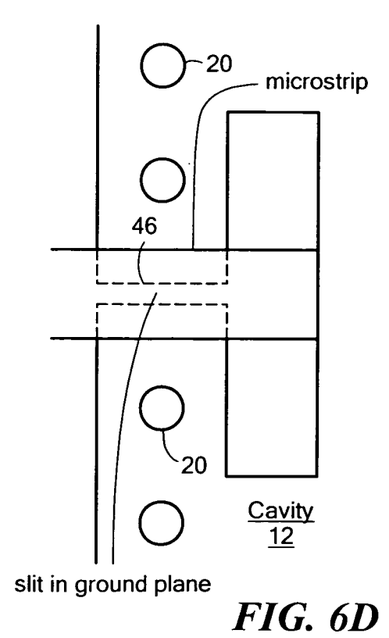

FIGS. 6A-D illustrate four exemplary structures for coupling to the resonant cavity. For example, a coplanar waveguide transmission line 30 may be coupled through a slot in cavity 12 as shown in FIG. 6A. A coplanar waveguide transmission line 34 may also be coupled physically through an offset via 36 inside cavity 12, as shown in FIG. 6B. FIG. 6C shows a microstrip transmission line 38 coupled through a slot in cavity 12, and physically shorted by a short circuit 42 to the ground plane. The microstrip line can be shorted as shown in FIG. 6C or alternatively: a) extended a quarter of a wavelength above the ground plane and then left open; or b) connected to the ground plane with an capacitor. FIG. 6D shows a microstrip transmission line 44 coupled through a slot in cavity 12 similar to 6C, but with open slit 46 in a ground plane underneath the microstrip transmission line.

A possible disadvantage of using discrete metal post connections in MMIC can be a reduction in the quality factor (Q). However, the inventors of the subject application have discovered that this reduction in Q is relatively insignificant, and can be attributed to three factors: 1) the leakage of high frequency signals out of the cavity; 2) the use of "lossy" semiconductor material within the cavity; and 3) the increased resistivity of metal posts compared to metal plated side walls. These three factors are described in turn below.

Leakage will be a function of the gap between metal posts, operating frequency and dielectric constant. For a typical MMIC this gap might be in the order of 100 um. Even for frequencies up to 40 GHz this is smaller than $\frac{1}{20}$th of a wavelength in a substrate such as GaAs. This small gap with respect to wavelength will not allow the energy to escape out of the resonator. As a consequence, this type of leakage will have little effect in reducing the overall quality factor of the resonator.

The use of a low conductivity semiconductor, such as gallium arsenide (GaAs), to define the cavity has a minimal effect on the overall Q. At high frequencies the dominant source of loss in semiconductor filled cavities is due to the metal boundaries of the cavity. This is explained in light of the increased metal resistance due to skin effect. Usually the metal losses or the loading brought on by the coupling ports determine the Q of a cavity. Another low conductivity semiconductor (i.e., high resistivity) that can be used is Silicon, which can be tolerated since the additional losses are comparable with metal losses.

The difference in resistivity through the use of metal posts is low enough that it does not affect the overall Q. The Q of a rectangular or polygonal cavity with relatively shallow depth is mainly determined by the resistive loss of the top and bottom metals relative to the volume of the cavity. The losses brought on by the side walls are negligible when compared with top and bottom metal losses. As the cavity depth is increased the Q will increase because the metal losses are relatively unchanged whereas the volume is increased.

Figures 7, 8:
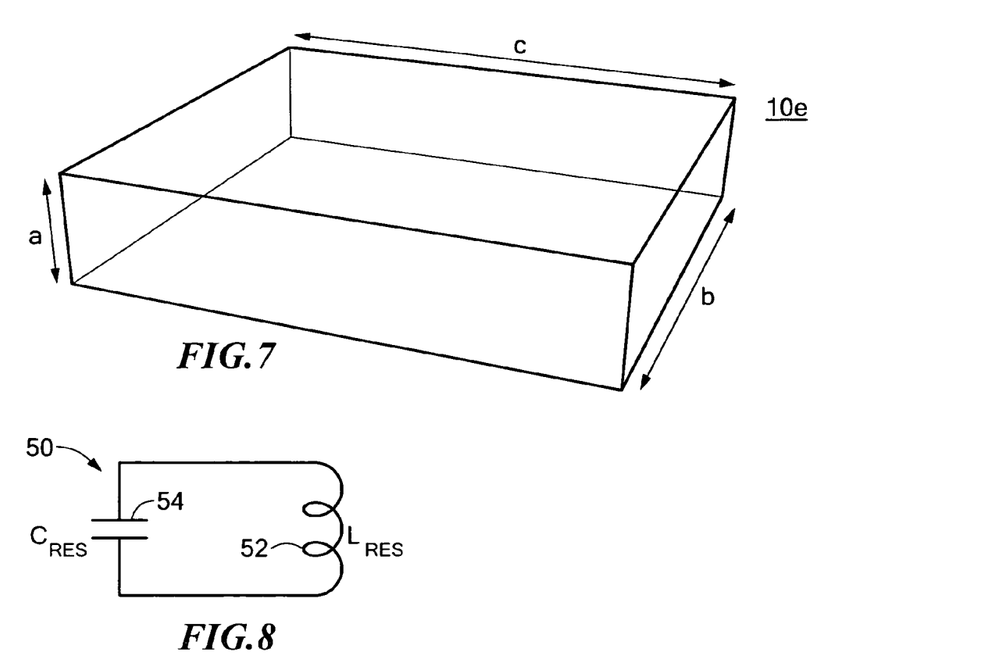
FIG. 7 is an isometric schematic diagram of a conventional, rectangular dielectric filled waveguide cavity resonator.
FIG. 8 is a circuit diagram of an LC model of a conventional cavity resonator.

In the rectangular cavity resonator 10e shown in FIG. 7, the lengths of the sides are "a", "b" and "c" where a<b<c. The resonance frequencies within such a cavity will be equal to $$\frac{\sqrt{\left(\frac{m}{a}\right)^2 + \left(\frac{n}{b}\right)^2 + \left(\frac{q}{c}\right)^2}}{2*\sqrt{\mu_0*\varepsilon_r}}$$

where m, n and q are integer numbers. The lowest resonance mode will be when m=0 and n=q=1, which yields $$\frac{\sqrt{\left(\frac{1}{b}\right)^2 + \left(\frac{1}{c}\right)^2}}{2*\sqrt{\mu_0*\varepsilon_r}}.$$

Hence, dimension "a" which is the thinnest dimension of the cavity is shown to have no influence on the lowest resonance frequency. Note that although examples are given for a rectangular polygon cavity, the present invention is not limited to a four sided resonator and can include a resonator with an N-sided polygon such as a polygon having three or more sides or may even be circular.

The resonant cavity can be modeled electrically as a parallel LC inductor capacitor pair 50, FIG. 8. For cavities where the depth is shallow, compared to the lateral dimensions, the resonance frequency is determined by the lateral geometry. The depth of the cavity determines the area spanned by the inductor (L) 52, and also the top to bottom plate capacitance (C) 54. A change in height creates a linear change in L 52 and an inverse linear change in C 54 such that the resonant frequency remains the same. Since the resistance of the top and bottom plates remains essentially unchanged, increasing the height of the resonator creates a linear increase in the Q of the resonator. For this reason use of thick dielectric is preferred.

Figure 9:
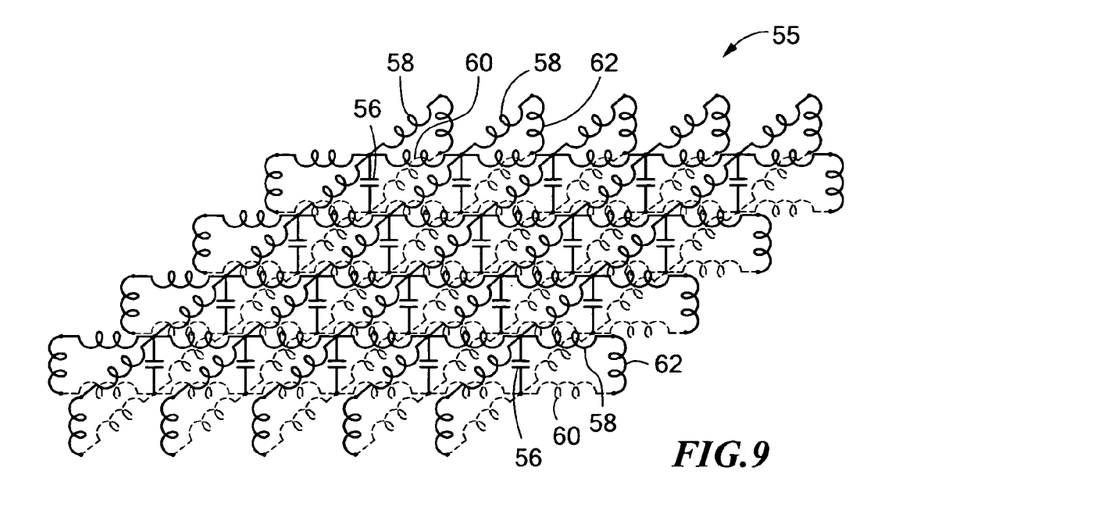
FIG. 9 is a circuit diagram of a model of a multi-element cavity resonator.
Figure 10:
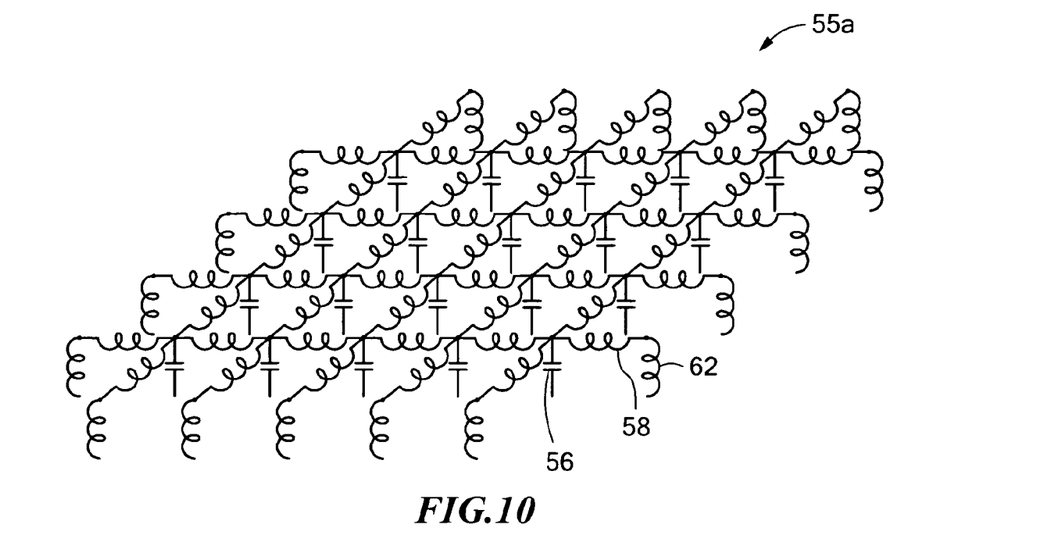
FIG. 10 is a circuit diagram of a model of a multi-element cavity resonator without bottom plate elements.

In FIG. 9, a representation 55 of the resonator cavity is broken down into smaller sections for further electrical modeling. The sections are made up of shunt capacitors 56 placed between sideways expanding top 58 and bottom 60 coupled inductors. These sections connect to each other until the side of the resonator is reached. When a side is reached, a metal post (represented by a small inductor 62) connects the top and bottom coupled inductors. FIG. 10 shows a similar representation 55a with the bottom inductors 60 removed for clarity.

Different electrical circuits can be inserted in different sections of electrical representation 55. Removing an inductive section 62 and replacing it with a different electrical circuit will force currents that initially flowed through the inductor to redistribute themselves. In this fashion, newly inserted circuits can affect the resonant frequency and can also serve as a means of coupling in and out of the cavity. For example, removing inductive section 62 to couple energy out of the resonator through an electrical port will depend on the amount of current that flows at the particular location and the port impedance.

Figure 11:
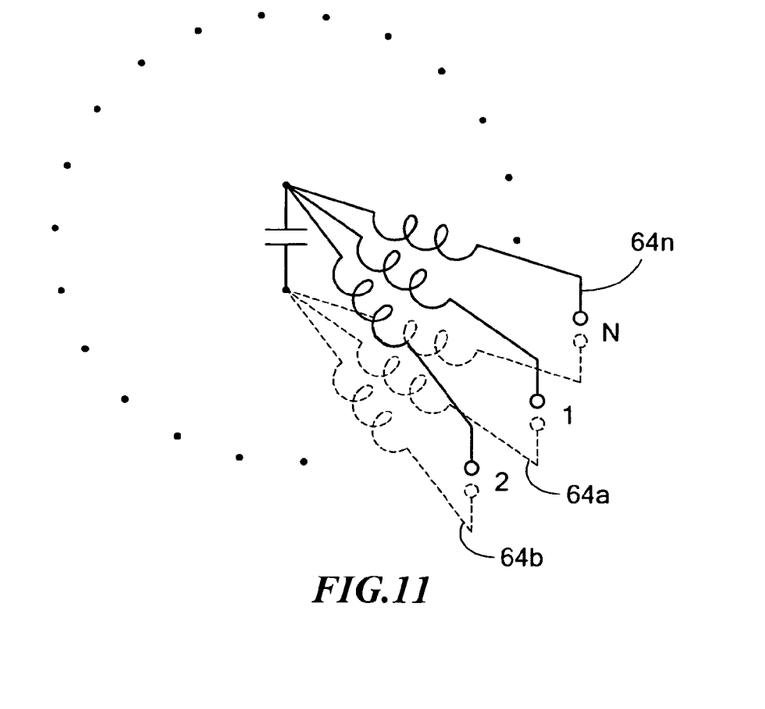
FIG. 11 is a circuit diagram of a model of a cavity resonator broken down to N slices and ports.
Figure 12:
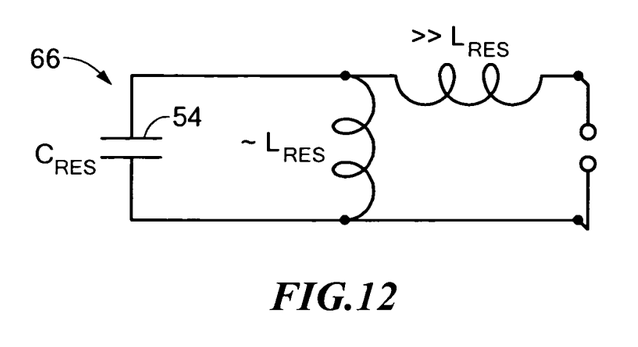
FIG. 12 is a circuit diagram of a model of a single port cavity resonator.
Figure 13:
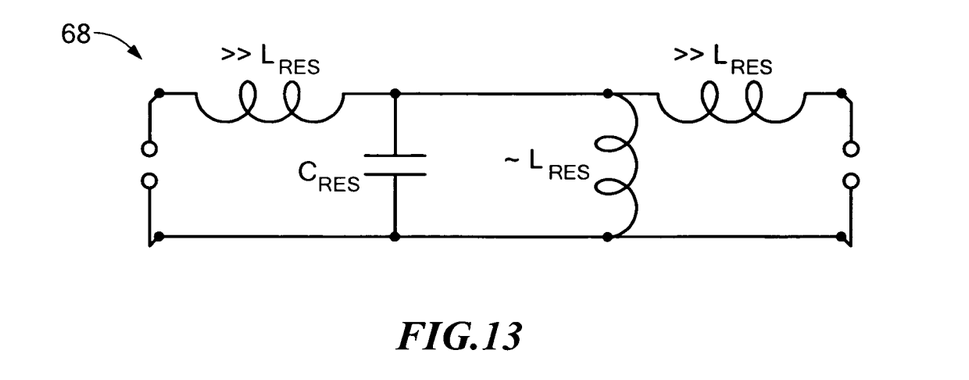
FIG. 13 is a circuit diagram of a model of a two port cavity resonator.

When the metal posts connecting the top and bottom coupled inductors 62 are replaced with individual ports a structure similar to the electrical representations 64a-64n in FIG. 11 are obtained. For the simple case of all ports but one terminated with metal posts, the basic high Q resonant cavity with one port is obtained. The equivalent of such a one port model is shown by the electrical representation 66 in FIG. 12. The electrical representation 68 of a two port cavity resonator is shown in FIG. 13.

Figure 14:
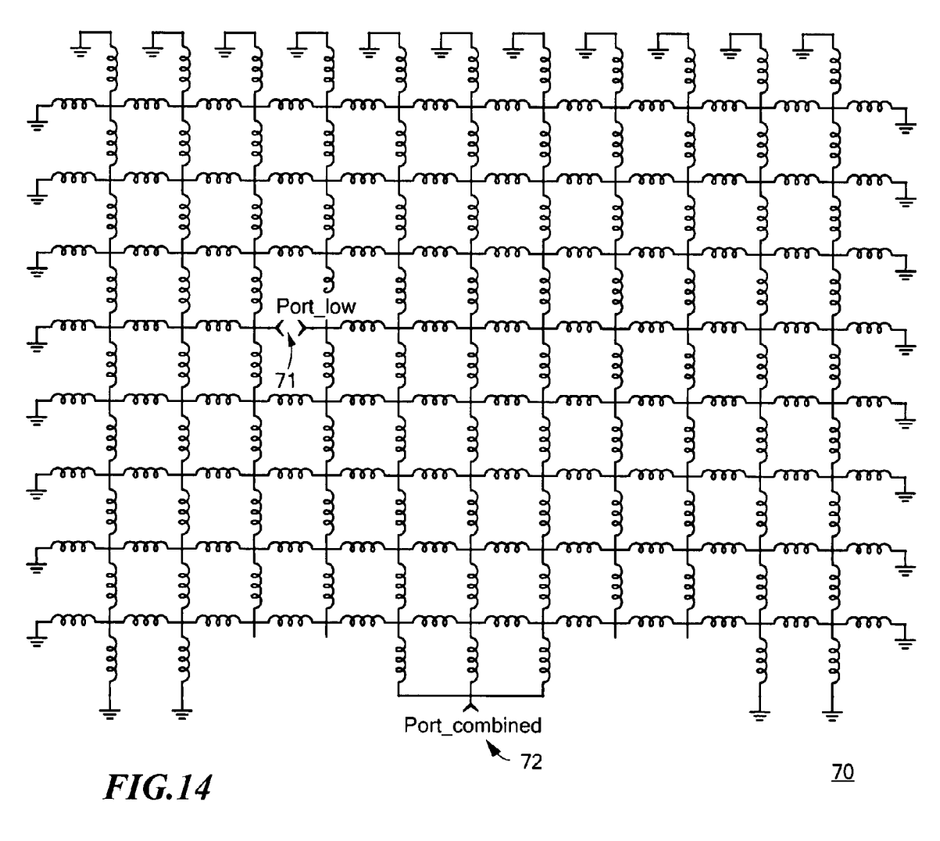
FIG. 14 is a circuit diagram of a model of a cavity resonator using port coupling.

Current flows from the center of the top and bottom plates outwards and grows in magnitude towards the edge. Coupling into the cavity can be reduced by placement of the coupling ports away from the edges. For example, port 71 (i.e., "Port_low") of representation 70 in FIG. 14 is chosen to be away from the edges. An optimum location is chosen for the amount of coupling desired.

Connecting adjacent ports together to form a single coupled port reduces the value of the series inductor, combines the currents and results in a port that is coupled more heavily into the resonator. The coupled port can be widened by physically connecting three ports together to obtain port 72 (i.e. "port_combined") in the representation 70 shown in FIG. 14. In the case where ports adjacent to the coupled port(s) are left open, more current will tend to flow through the coupled port(s). For example, a pair of nodes on each side of the port 66 is left open circuited to obtain more current flow through the port.

Figure 15:
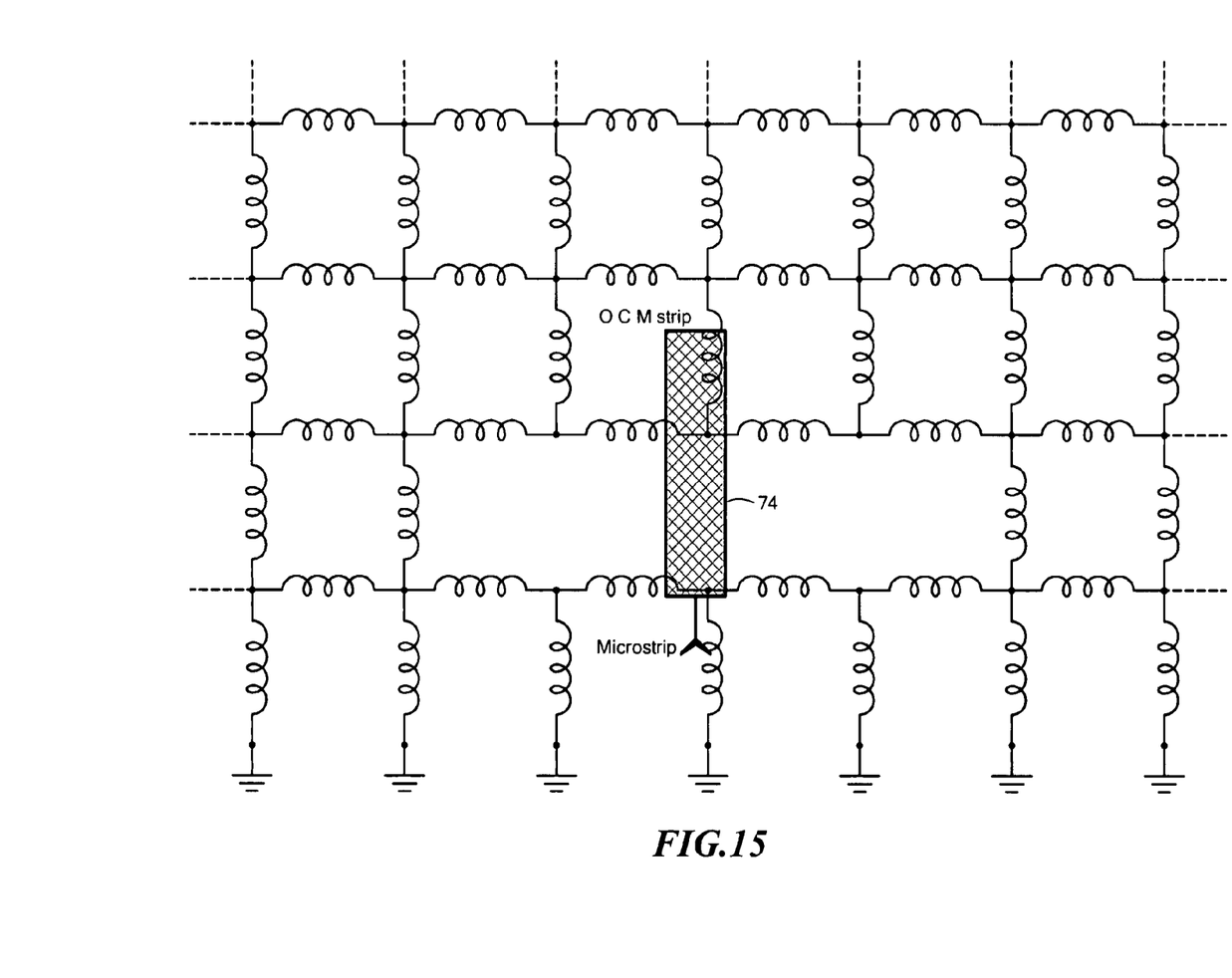
FIG. 15 is a depiction of the equivalent microstrip/slot coupling of the cavity resonator of FIG. 1.

The input impedance looking into a port is inherently inductive. If an additional metal layer is available, an open circuited stub 74 can be added in order to compensate the lead inductors as shown in FIG. 15. Note that this corresponds to the known microstrip/slot coupled structure.

Figure 16:
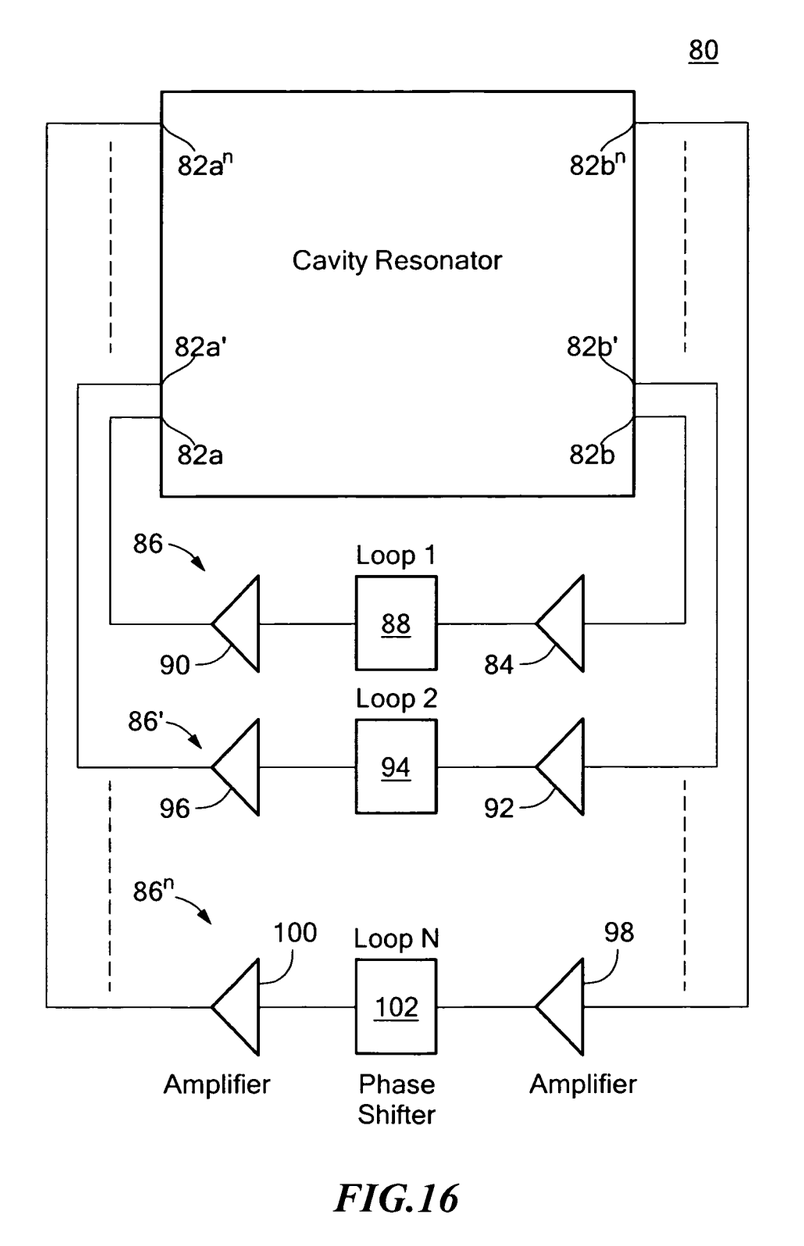
FIG. 16 is a circuit diagram of an oscillator integrated on a MMIC in accordance with another embodiment of the invention.

In another embodiment, any of cavity resonators 10-10d can be used as part of an oscillator or a voltage controlled oscillator. In FIG. 16, an oscillator 80 integrated on a MMIC includes a cavity resonator 10f. Cavity resonator 10f includes at least a first pair of ports 82a and 82b and may include additional ports 82a' ... 82a" and 82b' ..., 82b" for coupling to the cavity electromagnetically. An amplifier 84 is coupled between the ports 82a and 82b to provide a first feedback loop 86. Feedback loop 86 may include one or more additional elements. For example, a phase shifter 88 may be coupled in feedback loop 86 for tuning the frequency of the oscillator 80. One or more additional amplifiers such as amplifier 90 may also be coupled in feedback loop 86. A second feedback loop 86' may be coupled between ports 82a' and 82b' and include amplifiers 92 and 96. A phase shifter 94 may be coupled in the second feedback loop 86' for tuning the frequency of the oscillator. Similarly, a third feedback loop 86" coupled between ports 82a" and 82b" may include one or more elements, such as amplifiers 98 and 100 and a phase shifter 102 for tuning the frequency of the oscillator.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed:

those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant cannot be expected to describe certain insubstantial substitutes for any claim element amended.

Other embodiments will occur to those skilled in the art and are within the following claims.

What claimed is:

1. A semiconductor-based monolithic microwave integrated circuit (MMIC), comprising:
   a cavity resonator comprising:
      a cavity defined by an upper metal surface and a lower metal surface, the cavity being a low conductivity semiconductor material;
      a plurality of discrete metal connections coupled between the upper and lower metal surfaces; and
      at least one port for coupling to the cavity electromagnetically, and one or more active devices.

2. The MIMIC of claim 1 in which the plurality of discrete metal connections couple the upper and lower metal surfaces on at least three sides of the cavity.

3. The MMIC of claim 1 in which the cavity is an N-sided polygon.

4. The MIMIC of claim 3 in which the cavity is disposed on a semiconductor substrate having metallization layers and the metal posts connect the metallization layers.

5. The MMIC of claim 1 in which the cavity is circular.

6. The MMIC of claim 1 in which each metal connection of the plurality of discrete metal connections includes a metal post through the semiconductor material.

7. The MMIC of claim 6 in which each metal post includes a backside via.

8. The MMIC of claim 7 in which each backside via is approximately 100 um thick.

9. The MIMIC of claim 1 in which the plurality of metal connections is external to the MMIC and are selected from the group of conductive paste, wire bonds, ribbon bonds, and external packaging.

10. The MMIC of claim 1 further including a ferroelectric material disposed above or below the cavity for tuning a frequency of the cavity.

11. The MMIC of claim 1 in which the at least one port includes a plurality of ports that are coupled together to increase the output current.

12. The MMIC of claim 1 in which the low conductivity semiconductor is selected from the group consisting of gallium arsenide and silicon.

13. An oscillator comprising:
   a semiconductor-based monolithic microwave integrated circuit (MIMIC);
   a cavity resonator, including:
      a cavity defined by an upper metal surface and a lower metal surface, the cavity being a low conductivity semiconductor material,
      a plurality of discrete metal connections coupled between the upper and lower metal surfaces; and
      a first pair of ports for coupling to the cavity electromagnetically; and
   a first amplifier coupled between the first pair of ports of the cavity resonator in a first feedback loop,
   wherein the semiconductor-based MMIC includes:
      the cavity resonator; and
      the first amplifier.

14. The oscillator of claim 13 in which the plurality of discrete metal connections couple the upper and lower metal surfaces on at least three sides of the cavity.

15. The oscillator of claim 13 in which the cavity is an N-sided polygon.

16. The oscillator of claim 13 in which the cavity is circular.

17. The oscillator of claim 13 further including a first phase shifter coupled in the first feedback loop for tuning a frequency of the oscillator.

18. The oscillator of claim 17 further including one or more additional amplifiers coupled in the first feedback loop.

19. The oscillator of claim 13 in which the cavity resonator includes a second pair of ports for coupling to the cavity electromagnetically; and further including a second amplifier coupled between the second pair of ports in a second feedback loop.

20. The oscillator of claim 13 further including a second phase shifter coupled in the second feedback loop for tuning a frequency of the oscillator.

* * * * *

UNITED STATES PATENT AND TRADEMARK OFFICE
CERTIFICATE OF CORRECTION

| | | |
|---|---|---|
| PATENT NO. | : 9,000,851 B1 | Page 1 of 1 |
| APPLICATION NO. | : 13/548394 | |
| DATED | : April 7, 2015 | |
| INVENTOR(S) | : Ekrem Oran et al. | |

It is certified that error appears in the above-identified patent and that said Letters Patent is hereby corrected as shown below:

Specification

In column 2 at line 67, Change "for red" to --formed--.

Claims

In column 7 at line 23, In Claim 2, change "MIMIC" to --MMIC--.

In column 7 at line 28, In Claim 4, change "MIMIC" to --MMIC--.

In column 7 at line 39, In Claim 9, change "MIMIC" to --MMIC--.

In column 8 at line 10, In Claim 13, change "(MIMIC);" to --(MMIC);--.

In column 8 at line 42, In Claim 20, change "claim 13" to --claim 19--.

Signed and Sealed this
Nineteenth Day of January, 2016

Michelle K. Lee
*Director of the United States Patent and Trademark Office*